United States Patent [19]
Cranford, Jr. et al.

[11] Patent Number: 4,536,720
[45] Date of Patent: Aug. 20, 1985

[54] PROGRAMMABLE OSCILLATOR WITH POWER DOWN FEATURE AND FREQUENCY ADJUSTMENT

[75] Inventors: Hayden C. Cranford, Jr., Apex; Stacy J. Garvin, Durham, both of N.C.

[73] Assignee: International Business Machines Corporation, Armonk, N.Y.

[21] Appl. No.: 551,451

[22] Filed: Nov. 14, 1983

[51] Int. Cl.³ .............................................. H03K 3/354
[52] U.S. Cl. ..................................... 331/57; 307/297; 331/111; 331/173
[58] Field of Search ......................... 331/57, 111, 173; 307/297, 304

[56] References Cited

U.S. PATENT DOCUMENTS

| | | | |
|---|---|---|---|
| 3,978,431 | 8/1976 | Lattin | 331/57 X |
| 4,072,910 | 2/1978 | Dingwall et al. | 331/57 |
| 4,357,581 | 11/1982 | Higuchi | 331/111 X |
| 4,388,536 | 6/1983 | Peil et al. | 307/268 |
| 4,438,346 | 3/1984 | Chuang et al. | 307/297 |

*Primary Examiner*—Siegfried H. Grimm

[57] ABSTRACT

A programmable oscillator is provided for use on an integrated circuit chip. The oscillator includes a plurality of inverter delay stages connected in tandem between an input and an output node. A single FET device couples a node common to all of the inverter delay stages to a ground potential. Another FET device controls the input node. When a logic enabling signal is appropriately applied to the FET devices, the oscillator is controlled so that internal nodes of the oscillator float high when it is off and no energy is dissipated. In addition, the amount of delays between the delay stages and the input stage of the load is such that the load supplies the greater ratio of delays. This ensures that the oscillator's frequency of oscillation tracks the switching speed of the load.

4 Claims, 6 Drawing Figures

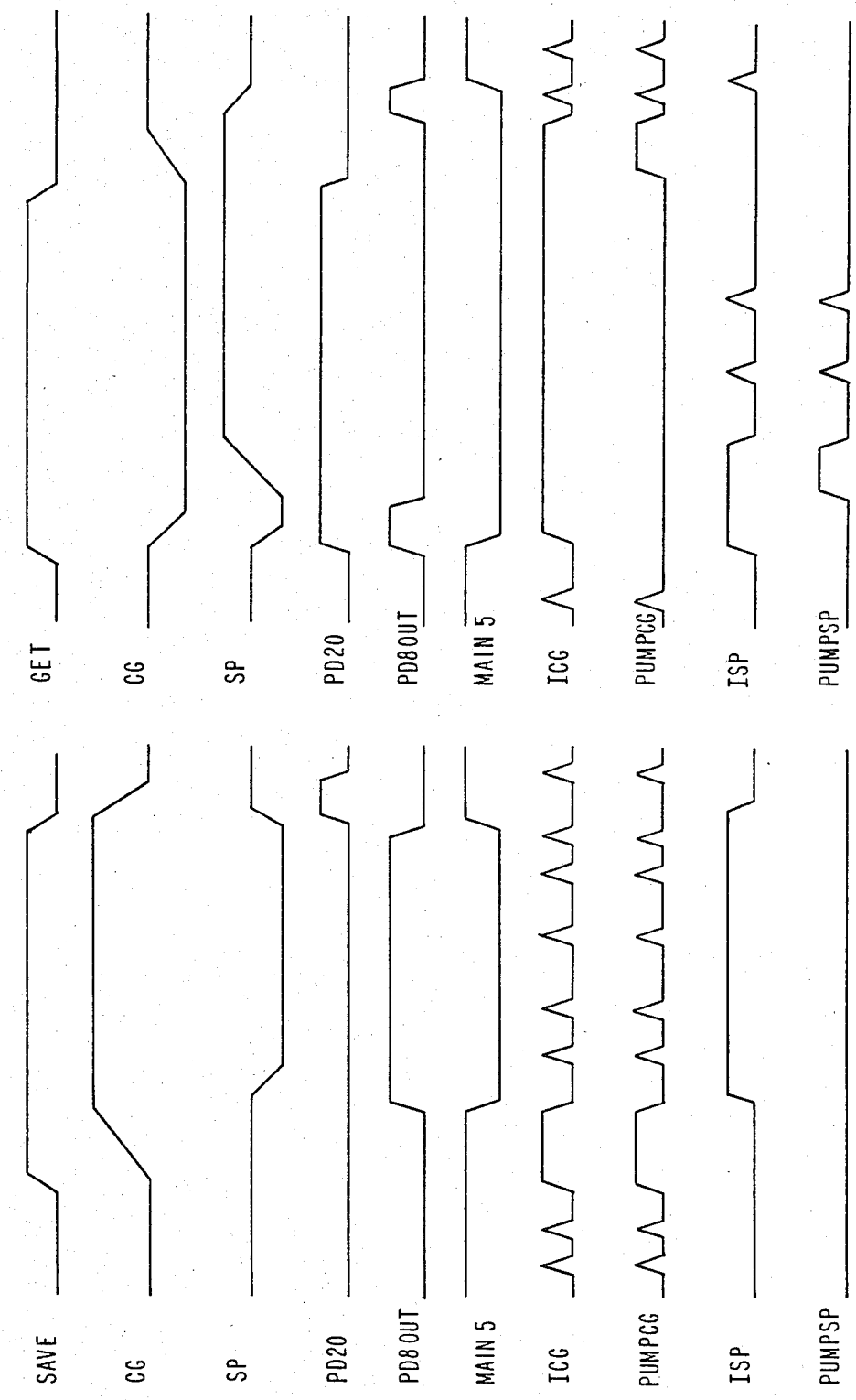

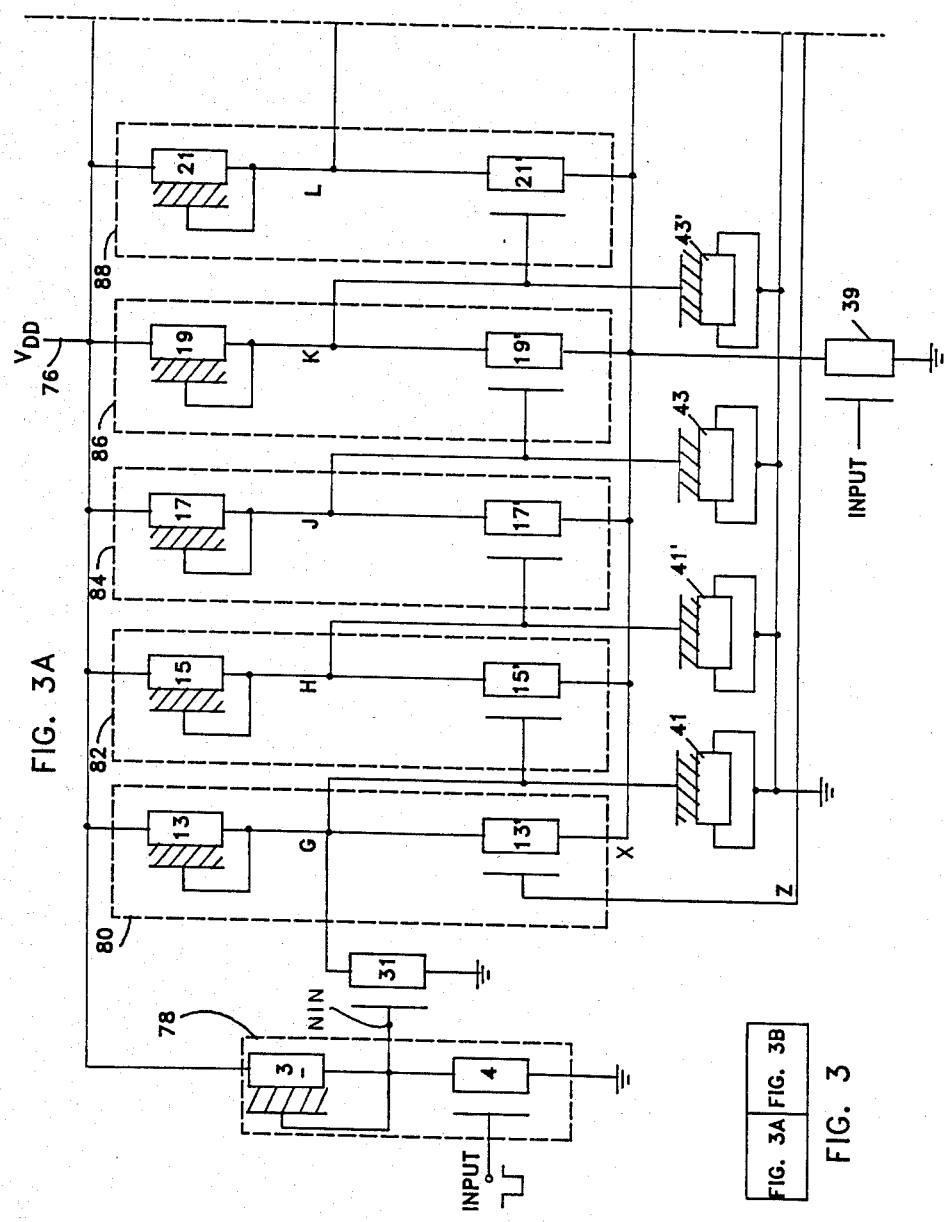

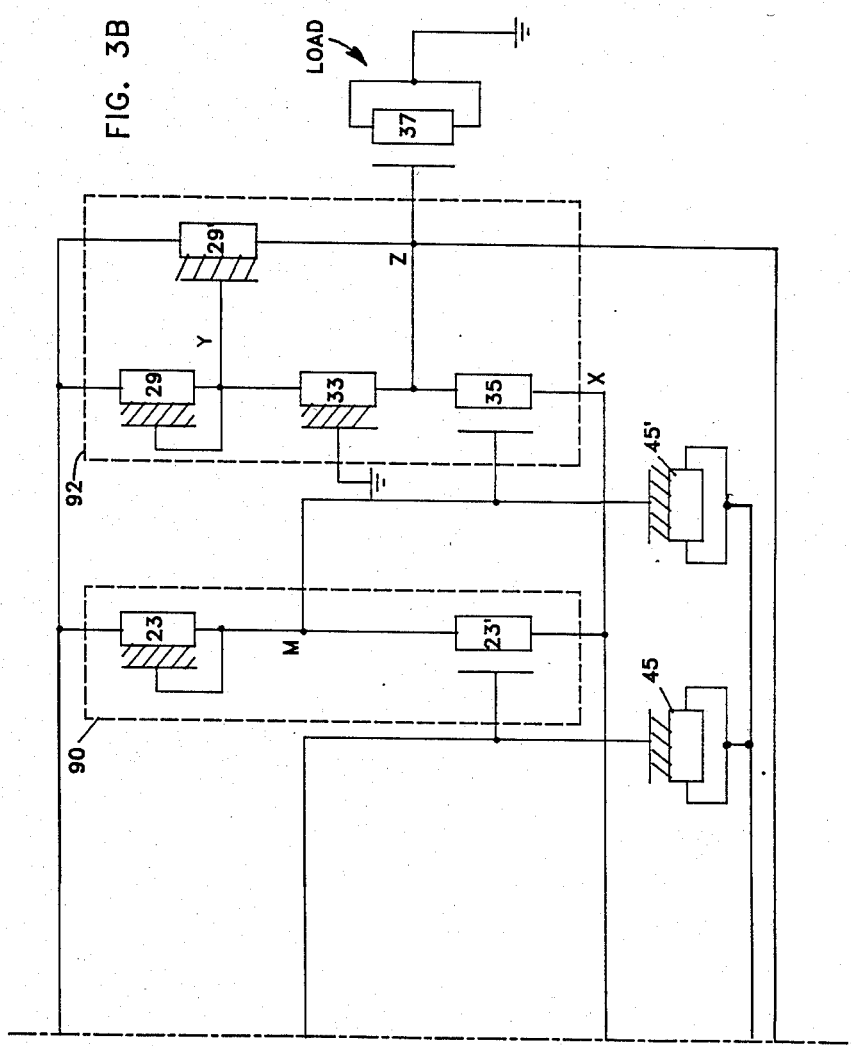

PROGRAMMABLE OSCILLATOR WITH POWER DOWN FEATURE AND FREQUENCY ADJUSTMENT

CROSS-REFERENCE TO RELATED APPLICATION

The present application relates to application Ser. No. 551,450, filed Nov. 14, 1983, by H. C. Cranford et al, and entitled, "Charge Pump System for Non-Volatile RAM."

The referenced application utilizes the programmable oscillator of the present invention to provide clocking signals for driving the charge pump.

BACKGROUND OF THE INVENTION

1. Field of the Invention

The invention relates to integrated circuit (IC) technology in general and more particularly to an on-chip oscillator.

2. Prior Art

The static non-volatile RAM chip and the newly developed dynamic non-volatile RAM chip are two types of semiconductor components which are used in conjunction with the processing of data. These components are usually used as memory elements. A typical static non-volatile RAM chip consists of a plurality of static non-volatile RAM cells. A typical non-volatile RAM cell consists of an EE PROM (Electrical Erasable Programmable Read Only Memory) cell connected to a latch. The latch is formed from a plurality (usually four) of FETs connected in a cross-coupled configuration. Single FET control devices are connected to each half of the latch.

Usually, an on-chip voltage generator is provided for NVRAM. The generator produces a voltage which is needed for the operation of the non-volatile cell. Most of the non-volatile static RAM chips require only one high voltage level (e.g., above plus 5 volts) for programming or erasing. The classical electrical circuitry used to provide the high voltage level is a free-running oscillator and a charge pump. The charge pump is made to run in an open-ended manner or it is clamped at a predetermined voltage. A more detailed discussion of prior art covering the non-volatile static RAM is given in an article entitled, "A 5 V-Only 16K EE PROM Utilizing Oxynitride Dielectrics and E PROM Redundancy," A. Gupta et al, p. 184 of the 1982 Digest of Technical Papers from the International Solid-State Circuit Conference. Another article entitled, "A Single 5 V Supply Non-Volatile Static RAM," Joseph Drori et al, p. 148 of the 1981 Digest of Technical Papers for the International Solid State Circuits Conference, gives an example of prior art in a non-volatile static RAM.

One of the drawbacks with the non-volatile static RAM is that it is a relatively low density device. The low density is due, in part, to the fact that a relatively large number of FET devices are used to form the cells of the non-volatile static RAM. A device which uses fewer FET devices will certainly yield a denser module.

The non-volatile dynamic RAM uses fewer FET devices and therefore provides a denser module. The newly developed non-volatile dynamic RAM cell consists of an EE PROM cell connected to a storage capacitor. One of the capacitor plates is attached to a fixed voltage and the other is coupled to an FET control device. The FET control device is also coupled to a sense amplifier. The sense amplifier senses the charge on the capacitor and instigates a refresh of the cell.

Because of the density and other inherent characteristics, the non-volatile dynamic RAM utilizes a more complex voltage generating system than the non-volatile static RAM. The dynamic RAM voltage generating system must provide a plurality of different voltage levels. To this end, the rather simple voltage generating system which is used to drive the non-volatile static RAM cell cannot be used to drive the non-volatile dynamic RAM cell.

SUMMARY OF THE INVENTION

The invention provides a programmable oscillator which can be stopped and/or energized with logic control signals. The oscillator includes an input and an output node with a series of inverted delay stages interconnected between the nodes. A singel FET device couples the inverter stages to ground. A similar FET device controls the input node. When the logic control signal is appropriately applied to the FET devices, the oscillator is controlled so that the internal nodes of said oscillator floats high when it is off and therefore no energy is dissipated.

In one feature of the invention, the ratio of delays between the inverted delay stages and the input stage of the load is such that the greater ratio of delays is supplied by the load. This ensures that the oscillator's frequency of oscillation tracks the switching speed of the load.

The foregoing features and advantages of the invention will be more fully described in the accompanying drawings.

BRIEF DESCRIPTION OF THE DRAWINGS

FIGS. 2A and 2B show timing diagrams for the voltage generating system of FIG. 1. The timing diagrams are helpful in understanding the operation of the voltage generating system.

FIGS. 3, 3A and 3B show a circuit diagram for an oscillator which provides clocking signals for the voltage generating system of FIG. 1.

DETAILED DESCRIPTION OF THE PREFERRED EMBODIMENT

Figure 1:
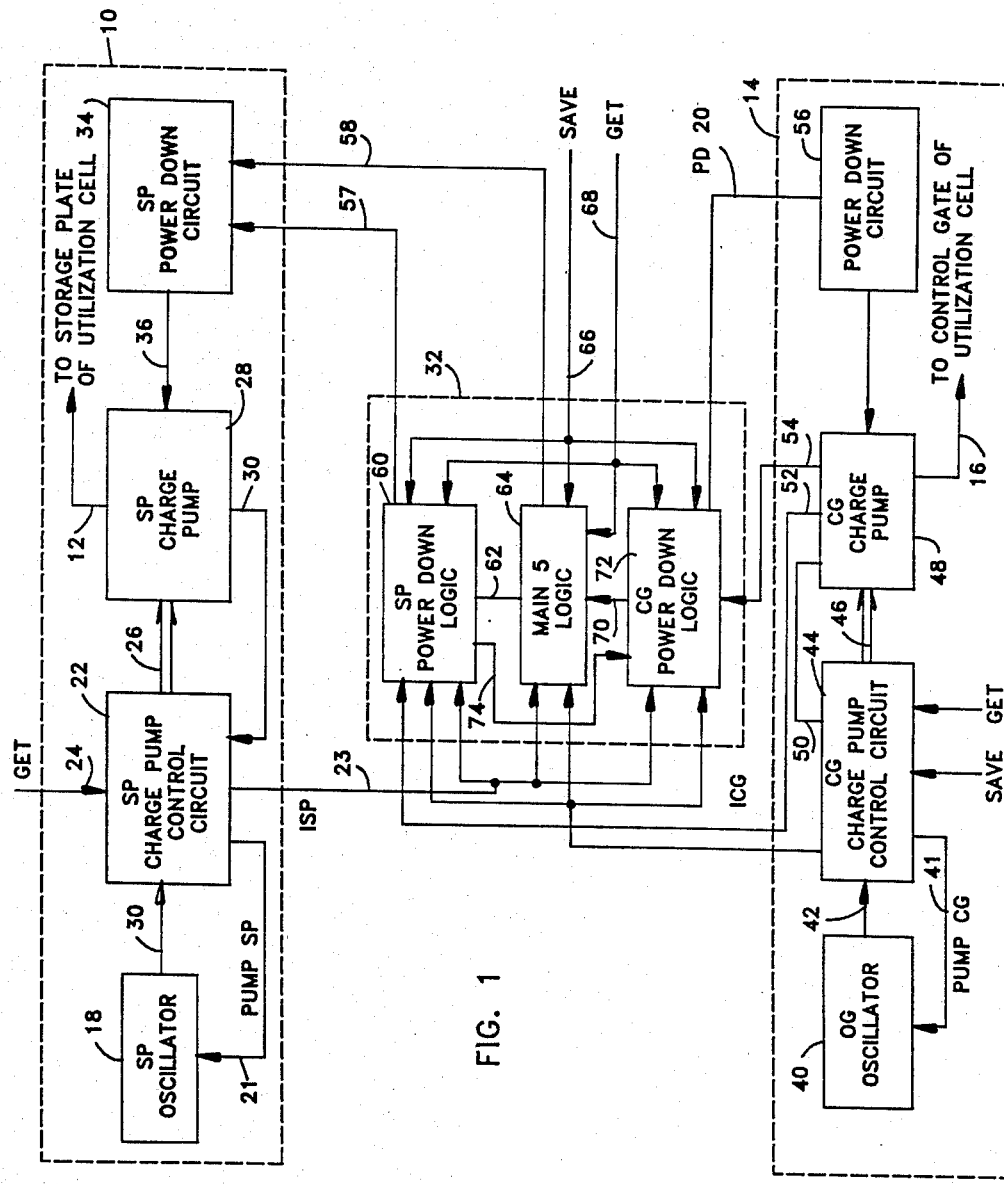
FIG. 1 shows a system block diagram for a voltage generating system according to the teaching of the present invention.

The present invention is intended to be used with many types of circuit modules. It works well with a non-volatile dynamic RAM cell, and as such will be described in that environment. However, this should not be construed as a limitation of the scope of the present invention since it is within the skill of one skilled in the art to make minor changes without departing from the spirit and scope of the present invention.

FIG. 1 shows a system block diagram according to the teaching of the present invention. The power generating system includes a charge pump system identified by numeral 10. The function of the charge pump system 10 is to generate a plurality of different voltage levels on conductor 12. The different voltage levels are generated in response to an externally generated control signal "GET." The different voltage levels on conductor 12 are supplied to the storage plate (not shown) of a utilization cell or device. In the preferrred embodiment of this invention the utilization cell is a non-volatile dynamic RAM. The externally generated signal GET is supplied to the charge pump system 10 when a particular voltage level is needed on the storage plate (SP) of the non-volatile RAM.

In addition to the voltage requirement of the storage plate, the control gate (CG) of the non-volatile dynamic RAM also requires a multiplicity of different voltage levels. These are supplied from a second charge pump system identified by numeral 14. The multiplicity of voltage signals are delivered to the control gate by conductor 16. A second externally generated control signal "SAVE" is supplied to the charge pump system 14 when a desired voltage level is needed on the control gate.

For brevity of description, the storage plate will be identified as SP. Likewise, the control gate will be identified as CG. The charge pump means 10 includes SP oscillator 18. As is used hereinafter, SP identifies devices which are dedicated to provide voltages for the storage plate of the utilization cell. A detailed description of the SP oscillator will be given hereinafter. Suffice it to say that it is a programmable oscillator and provides the clocking pulses on conductor 30 to drive SP charge pump control circuit 22. A control signal "pump SP" is supplied on conductor 21. This signal is used to control the operation of the SP oscillator.

As stated previously, the "GET" externally generated control signal is supplied on conductor 24 to the SP charge pump control circuit. The SP charge pump control circuit generates a two-phase control signal and supplies it on conductor 26 to the SP charge pump 28. A feedback signal from SP charge pump 28 is fed back on conductor 30 to the SP charge pump control circuit 22. Another control signal identified as "$I_{SP}$" is outputted on conductor 23. The $I_{SP}$ signal indicates when the SP is powered down to a predetermined voltage level. In the preferred embodiment the predetermined voltage level is 5 volts. The signal is fed into the power down logic circuit means identified by numeral 32. The function of logic means 32 is to monitor signals outputted from the control circuits and to generate appropriate enabling signals which activate the various power down circuits (to be described subsequently) and pull down the voltage level on the storage plate and/or the control gate. To this end the state of the signal on conductor 23 indicates when the voltage level on the storage plate needs to be changed or adjusted.

The function of SP charge pump 28 is to generate the appropriate voltage for the storage plate (not shown) of the utilization cell. SP charge pump 28 is a conventional capacitive type charge pump which accepts a multiphase signal on conductor means 26 and generates an appropriate voltage level at its output. This type of charge pump is well known in the prior art and a detailed description will not be given. Suffice it to say that as the signal moves along the cascaded capacitor stages, the voltage following the principle of voltage bootstrapping, is increased. When the voltage reaches a predetermined level the SP control circuit 22 deactivates charge pump 28. The control circuit 22 will reactivate the charge pump 28 as needed to maintain the proper voltage on conductor 12.

Still referring to FIG. 1, charge pump system 14 supplies the voltages for the control gate (CG). To this end, the components which interact to provide the voltages are identified with the label CG. Charge pump system 14 includes CG oscillator 40 with an input control signal "pump CG" connected thereto on conductor 41 and its output connected through conductor 42 to CG charge pump control circuit 44. The CG charge pump control circuit 44 generates a control signal "ICG" which is supplied on conductor ICG to the logic means 32. The two-phase output signal from CG charge pump control circuit 44 is supplied on conductor 46 to CG charge pump 48.

A pair of externally generated control signals identified as "SAVE" and "GET" are supplied to CG charge control circuit 44. Depending on the state of the signals, the charge pump is controlled to satisfy the requirement of these externally generated signals. The output from CG charge pump 48 is fed on conductor 16 to the control gate of the utilization cell (not shown). A feedback signal is fed from CG charge pump 48 on conductor 50 to the CG charge pump control circuit 44. Other control signals are fed on conductors 52 and 54, respectively, to the logic circuit means 32. The function of CG oscillator 40, CG charge pump control circuit 44, CG charge pump 48 and power down circuit 56 is similar to the function performed by the comparable devices in charge pump system 10. Since those functions have already been described, they will not be repeated here.

Still referring to FIG. 1, logic means 32 monitors the externally generated "SAVE" and "GET" signals, $I_{SP}$, $I_{CG}$ and other signals on conductors 52 and 54 and generates control signals on conductors 57, 58 and PD20. These signals are used to activate the power down circuit. To this end, the logic means 32 includes SP power down logic 60, main 5 logic 64, and CG power down logic 72. The input of SP power down logic 60 is coupled by conductors 23, $I_{CG}$ and 52 to SP charge pump control circuit 22, CG charge pump control circuit 44 and CG charge pump 48, respectively. The SP power down logic 60 generates a control signal "PD8 out" which is supplied on conductor 57 to activate the SP power down circuit. Another conductor 62 couples SP power down logic 60 to main 5 logic 64.

The function of main 5 logic 64 is to generate a control signal which is supplied on conductor 58 and inform SP power down circuit 34 that a 5 volt voltage level must be maintained on the storage plate of the utilization cell. This 5 volt level is supplied through a low resistance path to the input power source $V_{dd}$. The main 5 logic 64 is supplied with control signals on conductor 23, ICG, and the "SAVE" and "GET" signals on conductors 66 and 68, respectively. The main 5 logic 64 is connected by conductor 70 to CG power down logic 72.

The function of CG power down logic 72 is to generate a control signal "PD 20" and supply the same on conductor PD 20 to the CG power down circuit. The CG power down logic 72 is connected by conductor 54 to CG charge pump 48. The externally generated "SAVE" and "GET" control signals are delivered to CG power down logic 72 on conductors 66 and 68. Conductor 74 interconnects CG power down logic 72 with SP power down logic 60. Also, conductor 23 and ICG interconnect CG power down logic 72 to SP charge pump control circuit 22 and CG charge pump control circuit 44, respectively. Having described the functional components of the power generating system according to the teaching of the present invention, the operation of the overall system will now be given.

FIG. 2 shows a timing diagram for the system and will be used to describe the operation of the system. Similar names are used to identify common signals on the timing chart and in FIG. 1, respectively. The subject voltage generating system requires three external signals, namely: a power signal ($V_{dd}$) (to be described hereinafter), and the "SAVE" and "GET" control signals. These signals are supplied to the voltage generating system, of the present invention, when a particular voltage is needed on the storage plate and/or the control gate of the utilization cell.

Initially, the control gate (CG) is maintained at a first voltage level, say 8.5 volts, and the storage plate (SP) is held at a second voltage level, say $V_{dd}$, voltage level which is approximately 5 volts. In this state, the control gate (CG) charge pump 48 (FIG. 1) delivers 8.5 volts on conductor 16 while the +5 volts is maintained via the low resistance connection through SP power down circuit 34 to $V_{dd}$. The externally generated "SAVE" signal is now applied. The sense level of the sensing circuit associated with the control gate charge pump is raised to a predetermined voltage level. In the preferred embodiment of this invention the predetermined voltage level is 20 volts. This activates the charge pump 48 which pumps until the 20 volts sense level is reached. The circuit which senses the voltage on the output of the charge pump is located in the CG charge pump control circuit 44. As the 20 volt level is reached, the ICG control signal which is outputted from the CG charge pump control circuit 44 changes state. This signal is fed to the logic means 32 and indicates that the storage plate (SP) must be dropped to 0 volts. The logic activates the SP power down circuit 34 which discharges the storage plate to the desired voltage level. This signal also instructs the main 5 logic 64 to remove the $V_{dd}$ voltage signal on the storage plate.

When the "SAVE" signal is removed, the SP power down logic deactivates the SP power down circuit and instructs the main 5 logic to reconnect the storage plate to the $V_{dd}$ voltage supply.

At this time the sense level for the CG charge pump 48 sensing circuit is switched back to +8.5 volts and the CG power down circuit 56 is instructed to pull the output of the CG charge pump 48 down to 8.5 volts. When the CG charge pump reaches 8.5 volts, the power down circuit 56 is deactivated and the sense circuit (located in the CG charge pump control circuit 44) insures that the output remains at the 8.5 volts.

Still referring to FIGS. 1, 2A and 2B, the other mode of operation of the voltage generating system is adopted when the externally generated "GET" signal is applied. The electrical signals representing this mode of operation are shown in FIG. 2B. In this mode the sense level for the storage plate charge pump 28 is raised to 8.5 volts. However, before the charge pump begins to pump up to this new level, it is disabled by the SP charge pump control circuit 22 and the SP power down circuit is activated pulling the storage plate to ground. The "GET" control signal also disables the control gate charge pump 48 and enables the power down circuit 56 to pull the output of the CG charge pump to ground. Once the control gate is fully discharged, the SP power down circuit 34 is disabled and the SP control circuit 22 activates the SP charge pump 28 which charges the storage plate to 8.5 volts.

When the "GET" signal is removed, the CG power down circuit 56 is disabled and the CG control circuit 44 activates the CG charge pump 48. With the fall of "GET", the sense point of the SP sensing circuit is reestablished at 5 volts. When the control gate reaches 8.5 volts, the SP power down circuit 34 is activated and SP begins to fall. When the SP control circuit 22 senses +5 volts on the storage plate, the SP power down circuit 34 is turned off, and the main 5 logic establishes a low resistance path to the +5 volts ($V_{dd}$) supply.

The above-described multi-level voltage generating system is "user friendly" in that it requires a minimum number of input lines. Essentially, the system requires a single-ended power supply $V_{dd}$ and two control logic signals. The system provides multiple high voltages simultaneously. The oscillators and charge pumps are switched off when the high voltages are not being delivered, thus conserving power. The charge pump levels are sensed and controlled instead of being free running. Having described the voltage generating system and its operation, the description of the oscillator will now be given.

The Oscillator

FIGS. 3A and 3B show a circuit diagram of an oscillator suitable for use in FIG. 1. The oscillator to be described hereinafter may be used as the SP and/or CG oscillator. The output from the oscillator is used to provide the clocking signal which drives the charge pump control circuit. The input to the oscillator is the feedback signal identified in FIG. 1 as pump CG or pump SP. The SP and CG designation depends on whether the oscillator is coupled to the storage plate charge pump control circuit or the control gate control circuit. A power supply voltage $V_{dd}$ is supplied on conductor 76 to the oscillator. The oscillator is fabricated from FET devices. The depletion mode FETs are represented by a cross hatch section between the gate electrode and the rectangular portion of the device. The non-depletion mode FET does not have the cross hatch section.

The device includes an input inverter stage identified by numeral 78. A node identified as NIN is formed between devices 3 and 4, respectively. The node is tied to the gate of FET 31. The source electrode of device 31 is grounded and the drain electrode of device 31 is connected to node G. Node G represents the control node for the oscillator. It (that is, node G) is formed at the junction of devices 13 and 13', respectively. Devices 13 and 13' form an inverter stage of the oscillator and are identified by numeral 80. Inverter 80 is formed from a depletion mode FET 13 and a non-depletion mode FET 13'. The oscillator includes a plurality of other inverter stages identified by numerals 82, 84, 86, 88 and 90. Each stage is made up of similar electrical components as those in inverter stage 80. A node is disposed between the elements of each inverter stage. For example, node H is disposed between devices 15 and 15'. Node J is disposed between device 17 and 17' and so on.

Each of the nodes is tied to a plurality of capacitive loads identified by devices 41, 41', 43, 43', 45 and 45'. Devices 13', 15', 17', 19', 21', 23' and 35 are tied to a common node X and node X is coupled through device 39 to ground. Circuit means 92 is connected to node M. Circuit means 92 forms an inverter stage with a compound pull-up network. Its function is to create a high current flow at node Z which is tied back into device 13' to cause oscillation in the circuit. Circuit means 92 is comprised of devices 29, 29', 33 and 35. The device 37 is connected to node Z and represents the load which is driven by the oscillator. In this embodiment device 37 represents the input to the SP and/or CG charge pump control circuits 22 and 24, (FIG. 1) respectively. It has been determined that by making device 37 represent the largest portion of the circuit delay the tracking can be used to cause the oscillator to have a higher or lower frequency.

In operation, when the input is down, node G is held at ground by device 31. Device 39 is held off. This breaks the conductive path to ground allowing the internal nodes to float high. In this state the oscillator is stopped and power is not being dissipated.

When the input rises, Node X is grounded through device 39. After one inverter delay (caused by devices 3 and 4) the gate of device 31 is grounded and node G is released allowing it to be charged by device 13. This aids in starting the oscillation by causing instability at node G. Devices 41, 41', 43, 43', 45 and 45' form capacitive loads and control the circuit delays and hence the frequency of oscillation. Devices 29, 29', 33, and 35 form an inverter with a compound pull-up network. When node Z goes above a depletion threshold above ground, node Y charges rapidly to a predetermined voltage, say 5 volts. This provides a large gate drive voltage to drive device 29', and the output rises quickly. Oscillation is enabled by the fact that the feedback path goes from the output to the gate of device 13'.

Frequency of oscillation is determined by the summation of inverter delays through the circuit. In the preferred embodiment of this invention, the delays are due to the switching speed of the individual inverters. This switching speed is in turn governed by the various nodal capacitances. The period (1/f) relating to frequency of oscillation is:

$$T = 2(T_1 + T_2 + \ldots T_n)$$

where $T_n$ represents an individual inverter delay. Therefore, $$f = \frac{1}{2\Sigma T_n}$$

This expression holds true for an oscillator of any given number of inverters. In the case of the oscillator shown in FIG. 3, the last inverter delay is controlled by the output capacitance of the circuit being driven. This output capacitance is mainly composed of the gate capacitance of the input of the circuit being driven. In FIG. 3 this is shown by device 37. If device 37 represents the largest proportion of the circuit delay, the tracking of the device can be used to cause the oscillator to have a higher frequency when the circuit being driven utilizes a short channel FET as its input device and to have a lower frequency when the processing causes this device to have a longer channel. The shorter channel implies a greater width/length ratio and hence the ability to conduct more current. This will enble (due to device matching) the circuit being driven to operate at a higher switching speed.

Thus, by using the output load to provide a sizable portion of the total oscillator delay, the oscillator provides a higher frequency when the circuit being driven can be switched at this higher frequency. Likewise, the oscillator provides a lower frequency when the circuit being driven can only be switched at the lower frequency. In essence, the frequency of oscillation tracks the switching speed of the load.

Additionally, the oscillator can be started and stopped under logic control. No power is dissipated when the oscillator is in the off state.

While the invention has been particularly shown and described with reference to the preferred embodiments thereof, it will be understood by those skilled in the art that various changes in form and details may be made therein without departing from the spirit and scope of the invention.

Having thus described our invention, what we claim as new, and desire to secure by Letters Patent is:

1. An improved on-chip programmable oscillator comprising:
    an input node;
    an output node operable for attaching to a load;
    a first means coupled between the input and output node and operable for setting the circuit delay and the frequency of oscillation;
    a second means connected to the input node and operable for causing instability at the input node so as to initiate oscillation;
    a third means responsive to an enabling signal and operable for supplying a control signal to the second means;
    a feedback path interconnecting the output node to the first means and operable for ensuring the continuity of the oscillation;
    a fourth means operable to form a single conductive path between the first means and ground; said fourth means being responsive to an enabling signal and operable for disrupting the conductive path periodically; and
    a load means coupled to the output node and operable for providing the largest proportion of the circuit delay thereby enabling the frequency of said oscillator to track the switching speed of said load.

2. The programmable oscillator recited in claim 1 wherein the first means includes a plurality of inverter stages connected in tandem with each stage being formed from a pair of FET devices with at least one terminal of each device connected to a common node; and
    an FET device configured to operate as a capacitive load is being connected to the common node.

3. The programmable oscillator recited in claim 1 wherein the third means includes an inverter stage comprising a depletion mode FET device poled to conduct current into a node; and
    a non-depletion mode FET device connected to said node; said non-depletion mode FET device having an electrode connected to a ground potential and a gate electrode for receiving an enabling signal.

4. An improved on-chip programmable oscillator comprising:
    an input node;
    an output node operable for attaching to a load;
    a first means coupled between the input and output node and operable for setting the circuit delay and the frequency of oscillation;
    a second means connected to the input node and operable for causing instability at the input node so as to initiate oscillation;
    a third means responsive to an enabling signal and operable for supplying a control signal to the second means;
    a feedback path interconnecting the output node to the first means and operable for ensuring the continuity of the oscillation;
    a fourth means operable to form a single conductive path between the first means and ground; said fourth means being responsive to an enabling signal and operable to disrupt the conductive path periodically; and
    a pull-up electrical circuitry being connected to the output node and operable to adjust the voltage level at said output node so that a relatively small overdrive voltage is being applied to the load during a first instance of circuit operation following a larger overdrive voltage.

* * * * *